United States Patent [19]

Schacht et al.

[11] Patent Number: 5,834,531
[45] Date of Patent: Nov. 10, 1998

[54] CROSSLINKED POLYMERS

[75] Inventors: Hans-Thomas Schacht, Rheinfelden; Norbert Muenzel, Heltersheim; Carl-Lorenz Mertesdorf, Bad Krozingen, all of Germany; Pasquale Alfred Falcigno, Basel, Switzerland; Heinz Holzwarth, Bad Krozingen, Germany; Ottmar Rohde, deceased, late of Eimeldingen, Germany, by Li-Chun Tseng-Rohde, legal representative; Hans-Jorg Kirner, Pratteln, Switzerland

[73] Assignee: Olin Microelectronic Chemicals, Inc., East Providence, R.I.

[21] Appl. No.: 959,832

[22] Filed: Oct. 29, 1997

Related U.S. Application Data

[62] Division of Ser. No. 572,343, Dec. 14, 1995, Pat. No. 5,714,559.

[30] Foreign Application Priority Data

Dec. 20, 1994 [CH] Switzerland ............................. 3835/94
Feb. 15, 1995 [CH] Switzerland ............................. 441/95
Feb. 27, 1995 [CH] Switzerland ............................. 553/95

[51] Int. Cl.$^6$ ............................................. C08F 2/46
[52] U.S. Cl. .......................... 522/178; 522/186; 522/187
[58] Field of Search ..................... 522/178, 186, 522/187

[56] References Cited

U.S. PATENT DOCUMENTS 5,714,559  2/1998  Schacht et al. ........................ 526/313

*Primary Examiner*—Jeffrey T. Smith
*Assistant Examiner*—Wu C. Cheng
*Attorney, Agent, or Firm*—Ohlandt, Greeley, Ruggiero, Perle

[57] ABSTRACT

Radiation-sensitive compositions comprising a substance which forms acid under the action of actinic radiation and polymers based on combination of different repeating units derived from hydroxy styrene and hydroxy-vinylcyclohexane derivatives wherein a portion of the hydroxyl groups are replaced with either acid-labile acetal or ketal protecting groups and where a portion of the repeating groups comprise two crosslinked species connected via the protecting groups.

16 Claims, No Drawings

CROSSLINKED POLYMERS

CROSS-REFERENCE TO RELATED APPLICATIONS

This is a division of application Ser. No. 08/572,343, filed on Dec. 14, 1995, and which is incorporated herein by reference in its entirety.

BACKGROUND OF THE INVENTION

1. Field of the Invention

The present invention relates to crosslinked polymers based on styrene derivatives and vinylcyclohexane derivatives comprising hydroxyl groups, acid-labile acetal and ketal side groups and acid-labile bridges, to radiation-sensitive compositions comprising these polymers, to processes for the production of images using these compositions, and to the use of the compositions as positive resists.

2. Brief Description of the Relevant Art

The production of highly integrated circuits currently requires the ability for structures having a width of less than 0.35 μm to be transferred imagewise to the substrate. The resolution capacity, for example of an o-quinone diazide/novolak system, has reached the limits of the physically possible at a wavelength of 365 nm, which is used for the imagewise exposure. For this reason, there is increasing interest in photoresists which work at shorter wavelengths in the deep UV region (DUV region, deep, ultra violet: 200 to 300 nm). Novolaks absorb so strongly in this region that uniform exposure over the usual layer thickness of approximately 1.0 μm is impossible. In order to ensure the requisite optical transparency, poly(p-hydroxystyrene) or derivatives thereof are generally used as binder resins for photoresists working in the DUV region.

As is generally known, systems of increased radiation sensitivity comprise, for example, alkali-soluble binder resins whose alkali-solubilizing groups, for example hydroxyl groups, have been blocked by acid-labile protecting groups, thus rendering the binder resin substantially insoluble in alkali. Exposure then initiates a primary reaction of an acid photogenerator which absorbs at the appropriate wavelength, forming a strong acid which, in the subsequent secondary reaction, results in elimination of the protecting groups and thus in re-formation of the solubilizing groups.

An example which may be mentioned of such systems is poly(p-hydroxystyrene) whose phenol groups are protected by, for example, tert-butyloxycarbonyloxy (TBOC) or tetrahydropyranyl (THP) groups. Photoresists comprising such binder resins are known (see for example: M. J. Bowden and S. R. Turner (eds.) "Electronic and Photonic Application of Polymers", ACS Series 218, Washington 1988; and N. Hayashi et al., Polymer 33, 1583 (1992)), but have disadvantages concerning adhesion to silicon.

Furthermore, these chemically strengthened positive resists are very sensitive in terms of the process interval between the primary reaction and the subsequent secondary reaction.

Extended intervals (Post Exposure Delay), which become critical after only a few minutes in sensitive systems, result in considerable surface inhibition, leading to the formation of T-shaped denatured profiles (S. A. MacDonald et al., SPIE Vol. 1466, Advances in Resist Technology and Processing VIII (1991) 2–7).

Attempts have been made to improve adhesion, reproducibility and resolution in the resist formulations by using therein a binder resin whose phenolic hydroxyl groups have been replaced only partially by acid-cleavable protecting groups. One example of such attempts is EP-A 447,868, which proposes a radiation-sensitive mixture in which the phenolic resin is protected partially by tetrahydropyranyl groups.

EP-A 520,642 proposes poly(hydroxystyrene) polymers protected partially by acetal or ketal groups, which polymers are said to be likewise unhindered by the abovementioned disadvantages. It is known, however, that copolymers having free phenolic monomer units are subject to an increased occurrence of losses in thermal stability. Thermally induced decomposition (autocatalysis) can be attributed to a partial deprotection which results from the catalytic effect of the weakly acidic, phenolic hydroxyl groups. With the resists known to date this problem has not been solved satisfactorily, especially in the case of highly acid-labile protecting groups such as the acetal and ketal protecting groups. It is precisely these protecting groups, however, which are preferred, since they permit a relatively long interval between exposure and post exposure bake (and thus a greater scope in processing) than the less acid-labile protecting groups, for example the tert-butoxycarbonyloxy (TBOC) group or the tert-butyl ester protecting group.

U.S. Pat. No. 5,258,257 discloses photoresists which comprise an acid photogenerator and a partially hydrogenated poly(hydroxystyrene) in which not more than 50% of the hydroxyl groups have been blocked by acid-cleavable protecting groups. These photoresists are said to have a high transparency in the DUV region and to give high-resolution relief structures with near vertical edges; the post exposure delay time stability, however, is inadequate.

An important factor for the thermal flow resistance of the relief structures produced is the level of the glass transition temperature ($T_g$) of the binder resin. As the content of protecting groups increases, there is a decrease in $T_g$ and consequently in the flow resistance of the resist structures as well. A sufficiently high flow resistance (dimensional stability of the resist structures produced), however, is of fundamental importance for the plasma-chemical structural transfer (etching process) on the semiconductor substrate (TiN, $SiO_2$, Al, and the like) which follows the lithographic process.

BRIEF SUMMARY OF THE INVENTION

The object of the present invention is to develop novel polymers, and positive-working, highly active, radiation-sensitive systems resulting therefrom, especially for the production of relief structures, which polymers do not have the abovementioned disadvantages; in other words, they should in particular have good adhesion and processing stability, be sensitive to UV radiation, electron beams and X-rays and should be particularly suitable for use in the DUV region owing to their high optical transparency. They should also posses good thermal stability and a high contrast between the exposed and unexposed areas and should permit high resolution.

It has surprisingly been found that radiation-sensitive mixtures comprising partially crosslinked polymers based on styrene derivatives and vinylcyclohexane derivatives containing hydroxyl groups and acid-labile acetal and ketal side groups do not have the above-described disadvantages and are distinguished in particular by high optical transparency, very good processing stability and a high level of contrast between the exposed and unexposed areas.

The present invention relates to polymers having an average molecular weight $M_w$ (weight average) of from 5,000 to 1,000,000 (measured by means of gel permeation chromatography), comprising structural repeating units of the formulae I and II:

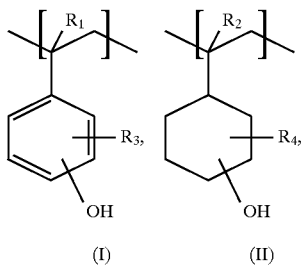

(I)   (II)

in which $R_1$ and $R_2$ independently of one another are hydrogen, methyl or halogen and $R_3$ and $R_4$ independently of one another are hydrogen, $C_1$–$C_6$alkyl, $C_1$–$C_6$alkoxy or halogen, in which structural units of the formulae I and II 5–90% of the hydroxyl groups are replaced by protecting groups of the formula III:

(III)

in which $R_5$ is $C_1$–$C_6$alkyl and $R_6$ is hydrogen or $C_1$–$C_6$alkyl, and $R_7$ is $C_1$–$C_{18}$alkyl, $C_5$–$C_{10}$cycloalkyl, $C_5$–$C_{14}$aryl or $C_6$–$C_{30}$aralkyl, it being possible for the alkyl, cycloalkyl, aryl or aralkyl groups to be unsubstituted or substituted by one or more hydroxyl groups, nitro groups or halogen atoms, wherein the polymer chains comprise structural units of the formula IV, V or VI:

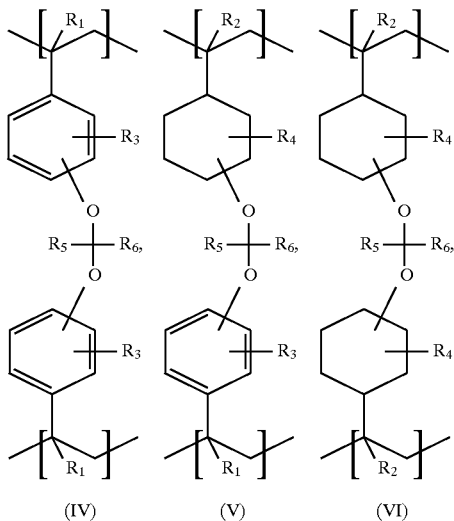

(IV)   (V)   (VI)

in which $R_1$ to $R_6$ are as defined above.

DETAILED DESCRIPTION OF PREFERRED EMBODIMENTS

Alkyl group substituents $R_3$ to $R_7$ can be linear or branched. Examples are methyl, ethyl, ethyl, n-propyl, isopropyl, n-butyl, sec-butyl, isobutyl, tert-butyl, n-pentyl, neopenthyl, isopentyl, n-hexyl and isohexyl.

Examples of alkoxy substituents are methoxy, ethoxy, n-propoxy, isopropoxy, n-butoxy and tert-butoxy.

Halogen atom substituents $R_1$ to $R_4$ are preferably chlorine, fluorine or bromine, and in particular chlorine.

Cycloalkyl groups $R_7$ are for example cyclopentyl, cyclohexyl, cycloheptyl and cyclooctyl.

Examples of aryl groups are phenyl, tolyl, mesityl, naphthyl and anthryl.

Preferred aralkyl groups are benzyl and phenylethyl.

Preferred polymers according to the invention are those comprising structural repeating units of the formulae Ia and IIa:

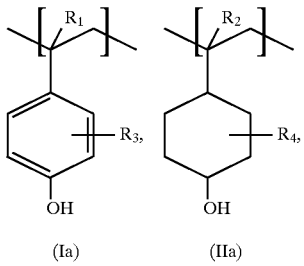

(Ia)   (IIa)

in which $R_1$, $R_2$, $R_3$ and $R_4$ are as defined above.

In the formulae I and II, $R_1$ and $R_2$ and $R_3$ and $R_4$, are preferably hydrogen.

Preferred protecting groups of the formula III are those in which $R_5$ is hydrogen and $R_6$ is methyl or ethyl.

Other preferred protecting groups of the formula III are those in which $R_7$ is methyl, ethyl, n-propyl, isopropyl, n-butyl, isobutyl, tert-butyl or cyclohexyl.

Particularly preferred protecting groups of the formula III are those in which $R_7$ is ethyl, tert-butyl or cyclohexyl.

Preferred polymers according to the invention are those comprising structural repeating units of the formulae I and II in which 7–65%, in particular 10–50%, of the phenolic hydroxyl groups have been replaced by protecting groups of the formula III.

In the polymers according to the invention the ratio of aromatic to cycloaliphatic structures can vary within a wide range. The polymers according to the invention preferably contain 1–40%, in particular 2–15%, of structural units of the formula II, and 60–99%, in particular 85–98%, of structural units of the formula I, based on the total number of all structural units.

The polymers according to the invention preferably have a molecular weight $M_w$ of from 6,000 to 500,000, particularly preferably from 8,000 to 200,000 and, in particular, from 10,000 to 150,000.

The polymers according to the invention can be obtained by known methods, for example by subsequent protection of hydroxyl-containing polymers comprising structural repeating units of the formulae I and II with vinyl ether compounds or isopropenyl ether compounds, for example with methyl vinyl ether, ethyl vinyl ether, n-butyl vinyl ether, tert-butyl vinyl ether, cyclohexyl vinyl ether, isopropyl vinyl ether, 2-methoxypropene and the like. Protection is preferably carried out in the presence of a suitable, usually acidic catalyst. Examples of such suitable catalysts are acidic ion exchange resins, acids, for example sulfonic acid, or salts thereof, for example pyridinium tosylate.

The hydroxyl-containing polymers comprising structural repeating units of the formulae I and II can be prepared by known methods, for example by copolymerization of the corresponding hydroxystyrene and vinylcyclohexanol derivatives, with or without further commonomers such as, for example, acrylic acid, methacrylic acid, alkyl methacrylate, alkyl acrylate, styrene, fumaronitrile, maleic anhydride or maleimide and derivatives thereof.

A preferred process for the preparation of hydroxyl-containing polymers comprising structural repeating units of the formulae I and II is the metal-catalyzed partial hydrogenation, described in JP-A 01/103604, of hydroxyl-containing homopolymers, for example poly(4-hydroxystyrene), poly(4-hydroxy-α-methylstyrene) and poly(3-hydroxystyrene), or copolymers formed from phenolic vinyl monomers and other monomer units, for example reaction products of 4-hydroxystyrene, 3-hydroxystryene, acrylic acid, methacrylic acid, alkyl methacrylate, alkyl acrylate, styrene, fumaronitrile, maleic anhydride or maleimide and derivatives thereof.

The incorporation of the protecting groups of the formula III by reaction of hydroxyl-containing polymers comprising structural repeating units of the formulae I and II with vinyl ether or isopropenyl ether compounds is accompanied by an increase in molecular weight which is in some cases considerable and can be attributed to the partial crosslinking of the polymer chains through structural units of the formulae IV, V or VI:

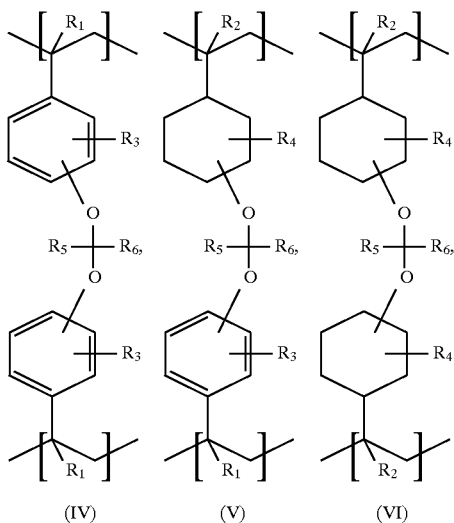

in which $R_1$ to $R_6$ are as defined above.

The presence of the crosslinked structures shown above can be detected, for example, by $^{13}C$ NMR spectroscopy.

The term "partial crosslinking" refers in the context of this description to a degree of crosslinking of 0.001–0.5, preferably of 0.002–0.25 and in particular of 0.01–0.15, degree of crosslinking in this context denoting the ratio of the number of structural units (IV)+(V)+(VI) to the total number of all protecting groups and hydroxyl-containing structural units (in other words, the sum of all structural units of the formulae I, II, IV, V and VI).

As indicated at the outset, the polymers according to the invention are employed in positive resist formulations for electronics (electroplating resists, etch resists and solder resists), in chemical milling, in the production of printing plates, such as offset printing plates or screen printing plates, and printed circuits and, in particular, in microelectronics for the production of integrated circuits.

The invention thus also relates to a radiation-sensitive composition comprising, based on the overall quantity of components (A) and (B), (A) 80.0–99.9% by weight, preferably 90–99.8% by weight, of a polymer according to the invention and (B) 0.1–20.0% by weight, preferably 0.2–10% by weight, of a substance which forms an acid on exposure to actinic radiation.

The polymers of component (A) contain acetal or ketal protecting groups which are eliminated by acid-catalysed events, so that the solubility of the mixture in an aqueous-alkaline solution is increased. The presence of the crosslinked structures IV, V and VI, which are likewise cleaved by the action of acid, brings about a particularly high solubility difference between the exposed and unexposed areas and therefore a very high level of contrast. Surprisingly, the resist compositions of the invention exhibit a very high resolution despite the high molecular weight of the binder polymers.

Furthermore, these mixtures are distinguished in particular by good processing stability, little loss in layer thickness in the unexposed areas, and by high thermal dimensional stability of the relief structures produced.

The radiation-sensitive components (B) which form or give off acids on exposure to actinic radiation can be any of a large number of known compounds. These include, for example, diazonium salts, as used in the diazotype process, o-quinone diazides, as used in known positive-working copying compositions, or halogen compounds which form hydrohalic acid on irradiation. Compounds of this type are described, for example, in U.S. Pat. Nos. 3,515,552, 3,536,489 or 3,779,778 and in DE-A 27 18 259, 22 43 621 or 26 10 842.

Suitable radiation-sensitive components (B) of the composition according to the invention are in particular cationic photoinitiators from the groups consisting of iodonium and sulfonium salts. Such compounds are described, for example, in "UV-Curing, Science and Technology" (Editor: S. P. Pappas, Technology Marketing Corp., 642 Westover Road, Stamford, Conn., USA).

It is also possible to use sulfoxonium salts as radiation-sensitive compounds. Such salts are described, for example, in EP-B 35,969 and EP-A 44,274 or 54,509. Particular mention should be made of aliphatic sulfoxonium salts which absorb in the deep UV region.

It is also possible to employ sulfonic acid esters as described, for example, in U.S. Pat. No. 5,118,582, U.S. Pat. No. 5,189,402 and in T. Uno et al., Polym. Eng. Sci. 32, 1511 (1992).

Also suitable are other sulfonic acid esters, for example N-sulfonyloxyimides, as described in EP-A 502,677, and nitrobenzyl sulfonates, as described in U.S. Pat. No. 5,135, 838. Other sulfonyl compounds which can be used are described in, for example, DE-A 42 25 422 and in Polym Eng. Sci. 32, 1476 (1992).

For irradiation with short-wave UV rays or electron beams, particular preference is given to disulfonic compounds, for example phenyl cumyl disulfone and phenyl 4-anisyl disulfone, which are described in DE 38 04 316.

Suitability additionally extends, in particular, to imino sulfonates as described, for example, in EP-A 241,423 and EP-A 571,330.

It is also possible to employ compounds which liberate sulfonic acids on irradiation with actinic light. Such compounds are known per se and are described, for example, in GB-A 21 20 263, in EP-A 84,515, 37,152 or 58,638, and in U.S. Pat. Nos. 4,258,121 or 4,371,605. Compounds which liberate carboxylic acid on irradiation can likewise be used. Such compounds are described, for example, in EP-A 552, 548.

If the radiation-sensitive acid-eliminating components (B) employed are salts, they are preferably soluble in organic solvents. With particular preference these salts are products with complex acids such as, for example, tetrafluoroboric acid, hexafluorophosphoric acid, trifluromethanesulfonic acid, hexafluoroarsenic acid or hexafluoroantimonic acid.

Preference extends to radiation-sensitive compositions comprising not only components (A) and (B) but also an organic solvent as component (C).

The choice of organic solvent for component (C) and its concentration depends principally on the nature of the composition of the resist formulation and on the coating process. The solvent should be inert, i.e. it should not undergo any chemical reaction with components (A) and (B), and it should be removable again on drying after coating. Examples of suitable solvents are ketones, ethers, esters and aromatic compounds, and any desired mixtures thereof. Examples of these are methyl ethyl ketone, isobutyl methyl ketone, cyclopentanone, cyclohexanone, N-methylpyrrolidone, dioxane, tetrahydrofuran, 2-methoxyethanol, 2-ethoxyethanol; acetates such as butyl acetate; 1-methoxy-2-propanol, 1,2-dimethoxyethane, diethylene glycol dimethyl ether, butylglycol, alkylene glycol monoalkyl ethers, for example ethylcellosolve, ethylene glycol monobutyl ether and methylcellosolve; alkylene glycol alkyl ether esters, such as methylcellosolve acetate, ethylcellosolve acetate, propylene glycol ethyl ether acetate and methoxypropyl acetate; and ethyl acetate, n-butyl acetate and ethyl 3-ethoxypropionate, and also methoxymethyl propionate, ethyl lactate, toluene and xylenes. Preferred organic solvents are ethyl lactate, ethoxyethyl propionate and, in particular, methoxypropyl acetate.

Preference is likewise given to compositions comprising, based on the overall quantity of components (A) and (B), from 0.01 to 40% by weight of customary additives in addition as component (D).

These customary additives are, for example, the following substances:

Pigments or dyes in quantities of from about 0.1 to 2% by weight, based on the overall quantity of components (A) and (B), for example Mikrolith Blau 4G, Orasolblau GN and Irgalithgrun;

Organic and inorganic fillers in quantities of from about 5 to 15% b weight, based on the overall quantity of components (A) and (B), such as talc, quartz ($SiO_2$), barium sulfate ($BaSO_4$), aluminium oxide and calcium carbonates, with which it is possible for example to enhance the properties of a coating, such as heat resistance, adhesion or scratch resistance;

Weakly basic additives (paint additives) in an overall quantity of from 0.01 to 10% by weight, based on the overall quantity of components (A) and (B), such as atifoams (for example Byk 80), adhesion promoters (for example benzotriazole), fungicides and thixotropic agents or hydroxy-terminated polyglycol ethers containing ethylene oxide and/or propylene oxide units, such as, for example, Tetronic 701, 901, 908P and 1501 (BASF products);

Surfactants for improving the wettability of the composition, for preventing streaking on the resulting film, for improving the developability of the irradiated area, etc. These surfactants include nonionic surfactants, for example polyoxyethylene lauryl ether, polyoxyethylene stearyl ether, polyoxyethylene oleyl ether, polyoxyethylene octylphenol ether, polyoxyethylene nonylphenol ether, polyoxyethylene glycol dilaurate and polyethylene glycol distearate; fluorinated surfactants, for example F Top EF 301, EF 303 and EF 352 (products of Shin Akita Kasei K.K.), Megafac F 171 and F 173 (products of Dainippon Ink & Chemicals), Fluorad FC 430 and FC 431 (products of Sumitomo 3M Limited), Asahi Guard Chemicals), fluorad FC 430 and FC 431 (products of Sumitomo 3M Limited), Asahi Guard AG 710, Surflon S-382, Surflon SC 101, SC 102, SC 103, SC 104, SC 105 and SC 106 (products of Asahi Glass Co., Ltd.). Use is also made, for example, of the organosiloxane polymer KP 341 (product of Shin-Etsu Chemical Co., Ltd.) and Polyflow No. 75 ad No. 95 (products of Kyoeisha Yushikagaku Kogyo K.K.), which are acrylic acid or methacrylic acid polymers. The quantity of surfactant used is about 0.01–0.1% by weight, based on the overall quantity of components (A) and (B);

Highly basic additives, such as aromatic and aliphatic amines, ammonium salts and N-containing heterocyclic compounds, usually in a concentration of from 0.01 to 1% by weight, based on the overall quantity of components (A) and (B); examples of such basic additives are 2-methylimidazole; triisopropylamine, 4-dimethylaminopyridine and 4,4'-diaminodiphenyl ether.

It is preferred to use an aliphatic or aromatic amine as component (D).

The resist formulations according to the invention are prepared, for example, by mixing components (A), (B) and, if used, (C) and (D) with stirring at room temperature to give a homogeneous solution.

The resist formulation is applied uniformly to the substrate at room temperature by known coating methods, for example by dipping, knife coating, brushing, spraying, especially electrostatic spraying and reverse roll coating, and in particular by spin coating.

The application rate (layer thickness) and the substrate type (layer support) are dependent on the desired area of application. The layer-thickness range generally covers values from 0.1 to more than 10 $\mu$m, preferably from 0.2 to 2.0 $\mu$m.

In microelectronics the substrate is, for example, a surface-oxidized silicon wafer.

After coating, the solvent is generally removed by drying, for example at temperatures of between 70° and 130° C.

The resist film is a photoresist which, after drying, has high sensitivity to actinic radiation and very good adhesion to the substrate. Furthermore, it has high transparency and sensitivity even in the deep UV region, especially at 250 nm, and has good thermal stability. In order to produce relief structures, the substrate coated with the novel composition is subjected to imagewise exposure. The term "imagewise" exposure covers both exposure through a photomask containing a predetermined pattern, for example a transparency, and exposure with a laser beam, which is moved over the surface of the coated substrate, for example under computer control, and in this way generates an image, irradiation with computer-controlled electron beams, and exposure to X-rays or UV radiation through a corresponding mask.

In general, exposure is carried out using UV and/or VIS radiation, preferably having a wavelength of between about 190 and 1000 nm, in particular from 190 to 300 nm, and especially between 245 and 250 nm. Irradiation can be carried out in principle using all known radiation sources, for example high-pressure mercury lamps or UV/VIS lasers and, in particular, excimer lasers (KrF excimer laser light having a wavelength of 248 nm). The radiation source can also be X-rays (for example synchrotron radiation) or beams of charged particles (for example electron beams), inter alia. The process parameters, for example the period of irradiation and the distance of the radiation source from the radiation-sensitive layer, generally depend on the nature of the radiation-sensitive composition and on the desired properties of the coating and can be determined by the person skilled in the art using a few routine experiments.

After imagewise exposure, the wafer is heated if desired at from 50° to 150° C. for a few seconds to a few minutes (post exposure bake).

The exposed areas of the photoresist are subsequently removed by dissolution in a developer. The choice of particular developer depends on the type of photoresist, especially on the nature of the binder used or of the photolysis products formed. The developer can comprise aqueous solutions of bases to which, if desired, wetting agents and organic solvents or mixtures thereof are added.

The compositions according to the invention are preferably used as positive resists. The invention therefore additionally relates to a process for the production of positive images which comprises the following process measures:

(I.) coating of a substrate with a radiation-sensitive composition comprising, based on the overall quantity of components (A) and (B),
- (A) from 80 to 99.9% by weight of a polymer according to the invention and
- (B) from 0.1 to 20% by weight of a substance which forms an acid on exposure to actinic radiation, (II.) exposure of the coated substrate to actinic radiation in a predetermined pattern, and (III.) development of the exposed substrate with a developer for positive-working resists.

Particularly preferred developers are aqueous-alkaline solutions as are also employed for the development of o-quinone diazide/novolak resist coatings. These include, for example, aqueous solutions of alkali metal silicates, phosphates, hydroxides and carbonates, but in particular tetraalkylammonium hydroxide solutions, for example tetramethylammonium hydroxide solutions. If desired, minor amounts of wetting agents and/or organic solvents can have been added to these solutions. Typical organic solvents which can be added to the developer liquids are, for example, cyclohexanone, 2-ethoxyethanol, acetone, isopropanol, ethanol, and mixtures of two or more of these solvents.

The developer is preferably applied by immersing the coated substrate which has been subjected to imagewise exposure into the developer solution, by spraying on the developer solution or by repeated application of the developer to the coated substrate, which has been subject to imagewise exposure, and removal of the developer by spinning.

The invention additionally relates to the use of the compositions according to the invention as positive resists for the production of printing plates, printed circuits or integrated circuits, and to the printing plates, printed circuits or integrated circuits produced using the compositions according to the invention.

The examples below illustrate the invention without limiting it to the examples. All parts and percentages are by weight and temperature are degree Celsius unless explicitly stated otherwise.

EXAMPLES

Synthesis Example 1

Polymer prepared from poly[4-hydroxystyrene/4-vinylcyclohexanol] and tert-butyl vinyl ether, having a protecting group content of 58% and a hydroxyl group content of 42%.

20.0 g of tert-butyl vinyl ether in 80 ml of tetrahydrofuran are added slowly dropwise at 10° C. to a solution of 48.0 g of partially hydrogenated poly-4-hydroxystyrene (Maruka Lyncur® PHM-C, $M_w$=4500, $M_w/M_n$=2, content of cycloaliphatic structural units about 10 mol %) and a catalytic quantity of 4-toluenesulfonic acid in 460 ml of tetrahydrofuran. The reaction mixture is subsequently stirred at room temperature for 5 h. The polymer is then precipitated by introducing the reaction solution into a water/ethanol mixture. 57.3 g are obtained of a nonlinear polymer which has the following properties:

Thermogravimetric analysis (10° C./min):

Difference Δ (in the region below 320° C.; onset at 185° C., peak at 217° C.): Δ=25.9% by weight, giving a protecting group content of 42% (the protecting group content is the percentage proportion of hydroxyl groups of the starting polymer which had been replaced by protecting groups of the formula III and by bridge members of the formulae IV V and VI);

Differential Scanning Calorimetry DSC (10° C./min): $T_g$=113° C.

GPC (polystyrene calibration): $M_w$=40 000, $M_w/M_n$=12

Synthesis Example 2

Polymer prepared from poly[4-hydroxystyrene/4-vinylcyclohexanol] and tert-butyl vinyl ether, having a protecting group content of 20% and a hydroxyl group content of 80%.

A catalytic quantity of 4-toluenesulfonic acid in 40 ml of 1,4-dioxane is added slowly dropwise at 10° C. to a solution of 24.0 g of partially hydrogenated poly-4-hydroxystyrene (Maruka Lyncur® PHM-C, $M_w$=4500, $M_w/M_n$=2) in 230 ml of 1.4-dioxane and 15.0 g of tert-butyl vinyl ether. The reaction mixture is subsequently stirred at room temperature for 6 h. The polymer is then precipitated by introducing the reaction solution into a water/isopropanol mixture. The polymer is filtered off, washed with a water/isopropanol mixture and then dried under reduced pressure to constant weight. 27.5 g are obtained of a nonlinear polymer which has the following properties:

$^{13}$C NMR: 20% protecting group content

TGA (10° C./min): Δ=14.8% by weight (in the region below 280° C.; onset at 155° C., peak at 198° C.)

GPC (polystyrene calibration): $M_w$=129 000, $M_w/M_n$=19

Synthesis Example 3

Polymer prepared from poly-4-hydroxystyrene and tert-butyl vinyl ether, having a protecting group content of 24% and a hydroxyl group content of 76%.

A catalytic quantity of 4-toluenesulfonic acid in 20 ml of tetrahydrofuran is added slowly dropwise at room temperature to a solution of 15.0 g of poly-4-hydroxystyrene ($M_w$=8000, $M_w/M_n$=6) in 80 ml of tetrahydrofuran and 3.1 g of tert-butyl vinyl ether. The reaction mixture is subsequently stirred at room temperature for 1 h. The polymer is then precipitated by introducing the reaction solution into water. The polymer is filtered off, washed with a water/isopropanol mixture and then dried under reduced pressure to constant weight. 17.8 g are obtained of a nonlinear polymer which has the following properties:

TGA (10° C./min): Δ=9.3% by weight, (in the region below 320° C.; onset at 165° C., peak at 190° C.), giving a protecting group content of 24%;

DSC (10° C./min): $T_g$=133° C.

GPC (polystyrene calibration): $M_w$=31 000, $M_w/M_n$=8

Synthesis Example 4

Polymer prepared from poly[4-hydroxystyrene/4-vinylcyclohexanol] and ethyl vinyl ether, having a protecting group content of 27% and a hydroxyl group content of 73%.

8.6 g of ethyl vinyl ether is added slowly dropwise to 10° C. to a solution of 20.0 g of partially hydrogenated poly-4- hydroxystyrene (Maruka Lyncur® PHM-C, $M_w$=4500, $M_w/M_n$=2) and a catalytic quantity of 4-toluenesulfonic acid in 120 ml of 1,4-dioxane. The reaction mixture is subsequently stirred at room temperature for 3 h. The polymer is then precipitated by introducing the reaction solution into a water/isopropanol mixture. The polymer is filtered off, washed with a water/isopropanol mixture and then dried under reduced pressure to constant weight. 19.5 g are obtained of a nonlinear polymer which has the following properties:

TGA (10° C./min): Δ=13.9% by weight (in the region below 310° C.; onset at 214° C., peak at 260° C.), giving a protecting group content of 27%;

DSC (10° C./min): endotherms between 211° C. and 270° C.; $T_g$=117° C.

GPC (polystyrene calibration): $M_w$=15 000, $M_w/M_n$=3

Synthesis Example 5

Polymer prepared from poly[4-hydroxystyrene/4-vinylcyclohexanol] and cyclohexyl vinyl ether, having a protecting group content of 57% and a hydroxyl group content of 43%.

25.2 g of cyclohexyl vinyl ether in 200 ml of dioxane are added slowly dropwise at 10° C. to a solution of 20.0 g of partially hydrogenated poly-4-hydroxystyrene (Maruka Lyncur® PHM-C, $M_w$=4500, $M_w/M_n$=2) and a catalytic quantity of 4-toluenesulfonic acid in 120 ml of 1,4-dioxane. The reaction mixture is subsequently stirred at room temperature for 5 h. The polymer is then precipitated by introducing the reaction solution into a water/ethanol mixture. The polymer is filtered off, dissolved in 200 ml of dioxane and again precipitated in a water/ethanol mixture. The polymer purified in this way is subsequently dried under reduced pressure to constant weight. 26 g are obtained of a nonlinear polymer which has the following properties:

$^{13}$C NMR: 57% protecting group content

TGA (10° C./min): Δ=34.3% by weight (in the region below 320° C.; onset at 205° C., peak at 217° C.)

GPC (polystyrene calibration): $M_w$=16 000, $M_w/M_n$=3

Synthesis Example 6

Polymer prepared from poly[4-hydroxystyrene/4-vinylcyclohexanol] and ethyl 1-propenyl ether, having a protecting group content of 44% and a hydroxyl group content of 56%.

A solution of 24.0 g of partially hydrogenated poly-4-hydroxystyrene (Maruka Lyncur® PHM-C), 12.9 g of ethyl 1-propenyl ether and a catalytic quantity of 4-toluenesulfonic acid in 270 ml of tetrahydrofuran is stirred at room temperature for 24 h. The polymer is subsequently precipitated by introducing the reaction solution into water. The product is filtered off and washed with water. After drying, 21.8 g of a colorless powder are obtained which has the following properties:

$^{13}$C NMR: 44% protecting group content

TGA (10° C./min): Δ=20.2% by weight (in the region below 280° C.; onset at 223° C., peak at 261° C.)

GPC (polystyrene calibration): $M_w$=11 000, $M_w/M_n$=6

Synthesis Example 7

Polymer prepared from poly[4-hydroxystyrene] and tert-butyl vinyl ether, having a protecting group content of 21% and a hydroxyl group content of 79%.

A solution of 22.5 g of poly-4-hydroxystyrene, 9.3 g of tert-butyl vinyl ether and a catalytic quantity of 4-toluenesulfonic acid in 95 ml of tetrahydrofuran is stirred at room temperature for 60 h. The polymer is subsequently precipitated by introducing the reaction solution into water. The product is filtered off and washed with water. After drying, 20.4 g of a colorless powder are obtained which has the following properties:

$^{13}$C NMR: 21% protecting group content

TGA (10° C./min): Δ=16.9% by weight (in the region below 290° C.; onset at 123° C., peak at 182° C.)

GPC (polystyrene calibration): $M_w$=149 000, $M_w/M_n$=55

Synthesis Example 8

Polymer prepared from poly[4-hydroxystyrene/4-vinylcyclohexanol] and tert-butyl vinyl ether, having a protecting group content of 28% and a hydroxyl group content of 72%.

A catalytic quantity of HCl in 30 ml of 1,4-dioxane is added dropwise at 10° C. to a solution of 48 g of partially hydrogenated poly-4-hydroxystyrene (Maruka Lyncur® PHM-C) and 35.0 g of tert-butyl vinyl ether in 500 ml of 1,4-dioxane. The reaction mixture is subsequently stirred at room temperature for 5 hours. The polymer is then precipitated by introducing the reaction solution into water. The product is filtered and washed with water. After drying, 52.9 g of a colorless powder are obtained which has the following properties:

$^{13}$C NMR: 28% protecting group content.

TGA (10° C./min): Δ=22.3% by weight (in the region below 280° C.; onset at 155° C., peak at 198° C.)

GPC (polystyrene calibration): $M_w$=43 000, $M_w/M_n$=9

DSC (10° C./min): $T_g$=125° C.

Application Example 1

96.8 parts by weight of the polymer from Synthesis Example 1, 1 part by weight of phenyl cumyl disulfone and 0.2 part by weight of 4,4'-diaminodiphenyl ether are dissolved in 1-methoxy-2-propyl acetate (photoresist solution 1, solids content 22%). The solution is subsequently filtered through a filter having a pore diameter of 9.2 μm and is spin-coated onto three silicon wafers in such a way that, after predrying at 120° C. for 60 s on a hotplate, a film having a thickness of 0.83 μm is obtained.

Wafer 1 (GPC analysis after predrying): $M_w$=38 000, $M_w/M_n$=16

Wafer 2 (GPC analysis after predrying and 200 mJ/cm$^2$ broadband deep-UV exposure): $M_w$=10 300, $M_w/M_n$=2.3

Wafer 3 (GPC analysis after predrying, 200 mJ/cm$^2$ broadband deep-UV exposure and drying to completion on the hotplate at 110° C. for 60 s): $M_w$=6500, $M_w/M_n$=1.3 (molecular weight of the starting material: $M_w$=4400, $M_w/M_n$=2.1)

Application Example 2

In a procedure similar to that of Application Example 1, photoresist solution 1 is spin-coated onto a silicon wafer in such a way that, after predrying for 60 s at 120° C. on a hotplate, a film having a thickness of 0.83 μm is obtained. Exposure (structuring) is carried out with a 5:1 projection exposure unit (Canon FPA 4500, NA 0.37, 248 nm KrF excimer laser radiation) through a resolution testing mask in 2 mJ/cm$^2$ steps. Drying of the wafer is then completed on the hotplate at 110° C. for 60 s, and the wafer is then developed for 60 s in commercial 0.262N tetramethylammonium hydroxide solution.

At an exposure dose of 75 mJ/cm², accurately reproduced positive sub-semimicron structures having vertical profiles are obtained. 0,35 μm lines are resolved.

Application Example 3

96.8 parts by weight of the polymer from Synthesis Example 2, 1 part by weight of phenyl cumyl disulfone and 0.2 part by weight 4,4'-diaminodiphenyl ether are dissolved in 1-methoxy-2-propyl acetate (photoresist solution 2, solids content 22%). The solution is subsequently filtered through a filter having a pore diameter of 0.2 μm and is spin-coated onto a silicon wafer in such a way that, after predrying at 120° C. for 60 s on a hotplate, a film having a thickness of 0.82 μm is obtained. Exposure is carried out with a 4:1 projection exposure unit (GCA XLS Stepper, NA 0.53) with KrF excimer laser radiation (248 nm) in 1 mJ/cm² steps. Drying of the wafer is then completed on the hotplate at 120° C. for 60 s, and the wafer is subsequently developed for 60 s in commercial 0.262N tetramethylammonium hydroxide solution.

At an exposure dose of 36 mJ/cm², accurately reproduced positive sub-semimicron structures having vertical profiles are obtained. 0.25 μm l/s structures are resolved.

Application Example 4

96.8 parts by weight of the polymer from Synthesis Example 3, 1 part by weight of phenyl cumyl disulfone and 0.2 part by weight of 4,4'-diaminodiphenyl ether are dissolved in 1-methoxy-2-propyl acetate (photoresist solution 3, solids content 22%). The solution is subsequently filtered through a filter having a pore diameter of 0.2 μm and is spin-coated onto a silicon wafer in such a way that, after predrying at 120° C. for 60 s on a hotplate, a film having a thickness of 0.83 μm is obtained. Exposure is carried out with a 5:1 projection exposure unit (Canon FPA 4500, NA 0.37) with KrF excimer laser radiation (248 nm) in 2 mJ/cm² steps. Drying of the wafer is then completed on the hotplate at 120° C. for 60 s, and the wafer is subsequently developed for 60 s in commercial 0.262N tetramethylammonium hydroxide solution.

At an exposure dose of 60 mJ/cm², accurately reproduced positive sub-semimicron structures having vertical profiles are obtained 0.30 μm l/s structures are resolved.

Application Example 5

96.8 parts by weight of the polymer from Synthesis Example 4, 3 parts by weight of phenyl cumyl disulfone and 0.2 part by weight of 4,4'-diaminodiphenyl ether are dissolved in 1-methoxy-2-propyl acetate (photoresist solution 4, solids content 22%). The solution is subsequently filtered through a filter having a pore diameter of 0.2 μm and is spin-coated onto a silicon wafer in such a way that, after predrying at 130° C. for 60 s on a hotplate, a film having a thickness of 0.82 μm is obtained. Exposure is carried out with a 5:1 projection exposure unit (Canon FPA 4500, NA 0.37) with KrF excimer laser radiation (248 nm) in 2 mJ/cm² steps. Drying of the wafer is then completed on the hotplate at 130° C. for 60 s, and the wafer is subsequently developed for 60 s in commercial 0.262N tetramethylammonium hydroxide solution.

At an exposure dose of 36 mJ/cm², accurately reproduced positive sub-semimicron structures having vertical profiles are obtained. 0.30 μm l/s structures are resolved.

Application Example 6

96.8 parts by weight of the polymer from Synthesis Example 5, 1 part by weight of phenyl cumyl disulfone and 0.2 part by weight of 4,4'-diaminodiphenyl ether are dissolved in 1-methoxy-2-propyl acetate (photoresist solution 5, solids content 22%). The solution is subsequently filtered through a filter having a pore diameter of 0.2 μm and is spin-coated onto a silicon wafer in such a way that, after predrying at 120° C. for 60 s on a hotplate, a film having a thickness of 0.8 μm is obtained. Exposure is carried out with a 5:1 projection exposure unit (Canon FPA 4500, NA 0.37) with KrF excimer laser radiation (248 nm) in 2 mJ/cm² steps. Drying of the wafer is completed on the hotplate at 100° C. for 60 s, and the wafer is subsequently developed for 60 s in commercial 0.262N tetramethylammonium hydroxide solution.

At an exposure dose of 40 mJ/cm², accurately reproduced positive sub-semimicron structures having vertical profiles are obtained. 0.35 μm l/s structures are resolved.

Application Example 7

96.85 parts by weight of the polymer prepared in Synthesis Example 8, 3 parts by weight of 2-nitro-6-(trifluoromethyl)benzyl 4-methoxybenzenesulfonate and 0.15 part by weight of 2,4,5-triphenylimidazole are dissolved in 354 parts by weight of 1-methoxy-2-propyl acetate. The solution is filtered through a filter having a pore diameter of 0.2 μm and is spin-coated onto a silicon wafer in such a way that, after predrying at 120° C. for 60 s on a hotplate, a film having a thickness of 0.82 μm is obtained. Exposure is carried out with a 5:1 projection exposure unit (Canon FPA 4500, NA 0.37) with KrF excimer laser radiation (248 nm) through a dark field mask in steps of 3 mJ/cm². Drying of the wafer is then completed on the hotplate at 120° C. for 60 s, and the wafer is subsequently developed for 60 s in commercial 0.262N tetramethylammonium hydroxide solution.

At an exposure dose of 25 mJ/cm², accurately reproduced vertical 0.35 μm l/s structures are obtained.

While the invention has been described above with reference to specific embodiments thereof, it is apparent that many changes, modifications, and variations can be made without departing from the inventive concept disclosed herein. Accordingly, it is intended to embrace all such changes, modifications, and variations that fall within the spirit and broad scope of the appended claims. All patent applications, patents, and other publications cited herein are incorporated by reference in their entirety.

What is claimed is:

1. A radiation-sensitive composition comprising, based on the overall quantity of components (A) and (B), (A) 80.0–99.9% by weight of a polymer having an average molecular weight $M_w$ (weight average) of from 5,000 to 1,000,000 (measured by means of gel permeation chromatography) comprising structural repeating units of the formulae (I), (II), (IV), (V) and (VI):

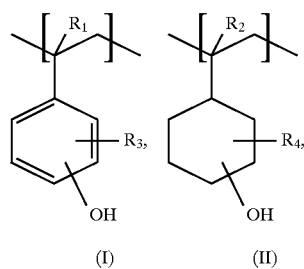

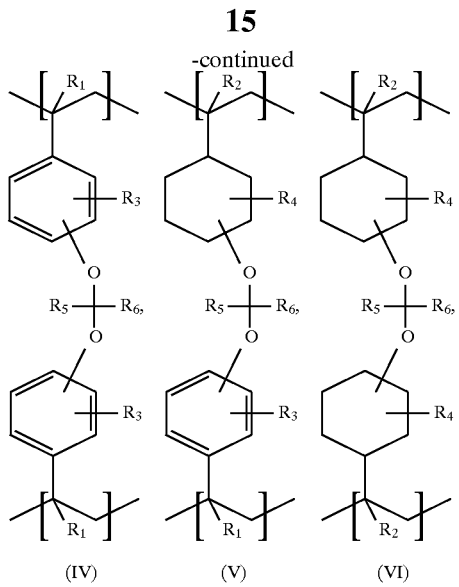

(IV)   (V)   (VI)

wherein each $R_1$ and $R_2$ are independently selected from the group consisting of hydrogen, methyl and halogen;

wherein each $R_3$ and $R_4$ are independently selected from the group consisting of hydrogen, $C_1$–$C_6$ alkyl, $C_1$–$C_6$ alkoxy and halogen;

wherein each $R_5$ is an unsubstituted or substituted $C_1$–$C_6$ alkyl, wherein the substituents are one or more hydroxyl groups, nitro groups or halogen atoms;

wherein each $R_6$ is selected from the group consisting of hydrogen or an unsubstituted or substituted $C_1$–$C_6$ alkyl, wherein the substituents are one or more hydroxyl groups, nitro groups or halogen atoms;

wherein 5–90% of the hydroxyl groups of formulae (I) and (II) are replaced by protecting groups of formula (III);

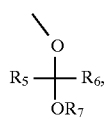

(III)

wherein each $R_7$ is selected from the group consisting of unsubstituted or substituted $C_1$–$C_{18}$ alkyl, $C_5$–$C_{10}$ cycloalkyl, $C_5$–$C_{14}$ aryl and $C_6$–$C_{30}$ aralkyl, wherein the substituents on said alkyl, cycloalkyl, aryl and aralkyl groups are one or more hydroxyl groups, nitro groups or halogen atoms; and wherein the ratio of the sum of structural units of formulae (IV), (V) and (VI) to the sum of structural units of (I), (II), (IV), (V) and (VI) is 0.001–0.5:1; and (B) 0.1–20.0% by weight of a substance which forms acid under the action of actinic radiation.

2. The radiation-sensitive composition of claim 1, wherein formula (I) and (II) have structural repeating units of formulae Ia and IIa, respectively:

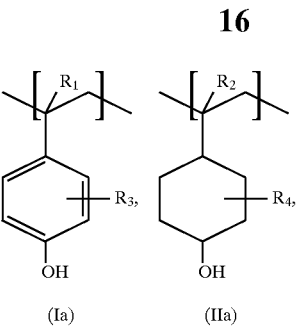

(Ia)   (IIa)

in which $R_1$, $R_2$, $R_3$ and $R_4$ are as defined in claim 1.

3. The radiation-sensitive composition of claim 1, in which $R_1$ and $R_2$ are hydrogen.

4. The radiation-sensitive composition of claim 1, in which $R_3$ and $R_4$ are hydrogen.

5. The radiation-sensitive composition of claim 1, in which $R_5$ is hydrogen and $R_6$ is methyl or ethyl.

6. The radiation-sensitive composition of claim 1, in which $R_7$ is methyl, ethyl, n-propyl, isopropyl, n-butyl, isobutyl, tert-butyl or cyclohexyl.

7. The radiation-sensitive composition of claim 1, in which $R_7$ is ethyl, tert-butyl or cyclohexyl.

8. The radiation-sensitive composition of claim 1, wherein 7–65% of the hydroxyl groups in the structural units of formulae (I) and (II) have been replaced by protecting groups of formula (III).

9. The radiation-sensitive composition of claim 1 wherein the ratio of aromatic groups in formulae (I), (IV), and (V) to the cycloaliphatic groups in formulae (II), (V) and (VI) is 1–40:99–60.

10. The radiation-sensitive composition of claim 1, wherein the average molecular weight is from 8,000 to 200,000.

11. The radiation-sensitive composition of claim 1, wherein the ratio of the sum of structural units of formulae (IV), (V) and (VI) to the sum of structural units of (I), (II), (IV), (V) and (VI) is 0.01–0.15:1.

12. The radiation-sensitive composition of claim 1, further comprising an organic solvent as component (C).

13. The radiation-sensitive composition of claim 1, further comprising an aliphatic or aromatic amine as component (D).

14. The radiation-sensitive composition of claim 1, wherein component (B) is disulfone compound.

15. A process for the production of positive images, comprising:

(I) coating a substrate with a radiation-sensitive composition of claim 1, (II) exposing the coated substrate to actinic radiation in a predetermined pattern, and (III) developing the exposed substrate with a developer for positive-working resists.

16. A printing plate, printed circuit or integrated circuit produced using a radiation-sensitive composition of claim 1.

* * * * *